United States Patent
Li et al.

(10) Patent No.: US 8,563,394 B2
(45) Date of Patent: Oct. 22, 2013

(54) INTEGRATED CIRCUIT STRUCTURE HAVING SUBSTANTIALLY PLANAR N-P STEP HEIGHT AND METHODS OF FORMING

(75) Inventors: Weipeng Li, Ossining, NY (US); Deleep R. Nair, Fishkill, NY (US); Jae-Eun Park, Wappingers Falls, NY (US); Voon-Yew Thean, Fishkill, NY (US); Young Way Teh, Singapore (SG)

(73) Assignees: International Business Machines Corporation, Armonk, NY (US); GLOBALFOUNDRIES Inc., Grand Cayman (KY)

( * ) Notice: Subject to any disclaimer, the term of this patent is extended or adjusted under 35 U.S.C. 154(b) by 150 days.

(21) Appl. No.: 13/083,631

(22) Filed: Apr. 11, 2011

(65) Prior Publication Data

US 2012/0256268 A1  Oct. 11, 2012

(51) Int. Cl.
*H01L 21/76* (2006.01)

(52) U.S. Cl.
USPC .................. 438/424; 257/E21.237; 257/369

(58) Field of Classification Search
USPC ..................... 438/424; 257/E21.09
See application file for complete search history.

(56) References Cited

U.S. PATENT DOCUMENTS

| 7,241,665 B2 * | 7/2007 | Kim et al. ...................... 438/424 |
| 2006/0086971 A1 * | 4/2006 | Takahashi et al. ............. 257/324 |
| 2008/0237733 A1 * | 10/2008 | Chen et al. ..................... 257/374 |
| 2008/0311714 A1 * | 12/2008 | Doris et al. ................... 438/229 |
| 2009/0102010 A1 * | 4/2009 | Ema et al. ..................... 257/506 |
| 2010/0244198 A1 | 9/2010 | Jaeger et al. |

* cited by examiner

*Primary Examiner* — Wael Fahmy
*Assistant Examiner* — Sarah Salerno
(74) *Attorney, Agent, or Firm* — Yuanmin Cai; Hoffman Warnick LLC

(57) ABSTRACT

Solutions for forming an integrated circuit structure having a substantially planar N-P step height are disclosed. In one embodiment, a method includes: providing a structure having an n-type field effect transistor (NFET) region and a p-type field effect transistor (PFET) region; forming a mask over the PFET region to leave the NFET region exposed; performing dilute hydrogen-flouride (DHF) cleaning on the exposed NFET region to substantially lower an STI profile of the NFET region; and forming a silicon germanium (SiGe) channel in the PFET region after the performing of the DHF.

15 Claims, 5 Drawing Sheets

INTEGRATED CIRCUIT STRUCTURE HAVING SUBSTANTIALLY PLANAR N-P STEP HEIGHT AND METHODS OF FORMING

BACKGROUND OF THE INVENTION

The subject matter disclosed herein relates to an integrated circuit structure having a substantially planar N-P step height, and methods of forming such a structure.

In integrated circuits, particularly field effect transistors (FETs), utilizing high-k dielectric metal gates, silicon germanium (SiGe) has frequently been used as a channel material. During the process of SiGe growth and patterning in FET structures, the p-type FET (PFET) shallow trench isolation (STI) step height is often not co-planar (or, substantially level) with the n-type FET (NFET) STI. This height disparity can cause degraded performance in the FET and its corresponding integrated circuit structure.

BRIEF SUMMARY OF THE INVENTION

Solutions for forming an integrated circuit structure having a substantially planar N-P step height are disclosed. In one embodiment, a method includes: providing a structure having an n-type field effect transistor (NFET) region and a p-type field effect transistor (PFET) region; forming a mask over the PFET region to leave the NFET region exposed; performing dilute hydrogen-flouride (DHF) cleaning on the exposed NFET region to substantially lower an STI profile of the NFET region; and forming a silicon germanium (SiGE) channel in the PFET region after the performing of the DHF.

A first aspect includes a method comprising: providing a structure having an n-type field effect transistor (NFET) region and a p-type field effect transistor (PFET) region; forming a mask over the PFET region to leave the NFET region exposed; and performing dilute hydrogen-flouride (DHF) cleaning on the exposed NFET region to substantially lower an STI profile of the NFET region; and forming a silicon germanium (SiGE) channel in the PFET region after the performing of the DHF.

A second aspect includes a method of forming an integrated circuit structure having a substantially planar shallow trench isolation (STI) profile across an n-type field effect transistor (NFET) region and a p-type field effect transistor (PFET) region, the method comprising: providing a structure having the NFET region and the PFET region; forming a mask over the PFET region to leave the NFET region exposed; and performing dilute hydrogen-flouride (DHF) cleaning on the exposed NFET region to substantially lower an STI profile of the NFET region, wherein the substantially lower STI profile allows for planarizing of the STI profile of the NFET region and an STI profile of the PFET region after subsequent formation of a silicon germanium (SiGe) portion of the PFET region.

A third aspect includes an integrated circuit structure having: an n-type field effect transistor (NFET) region having a first shallow trench isolation (STI) step height; and a p-type field effect transistor (PFET) region having a second STI step height; wherein the first STI step height is located at approximately a same device depth as the second STI step height.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
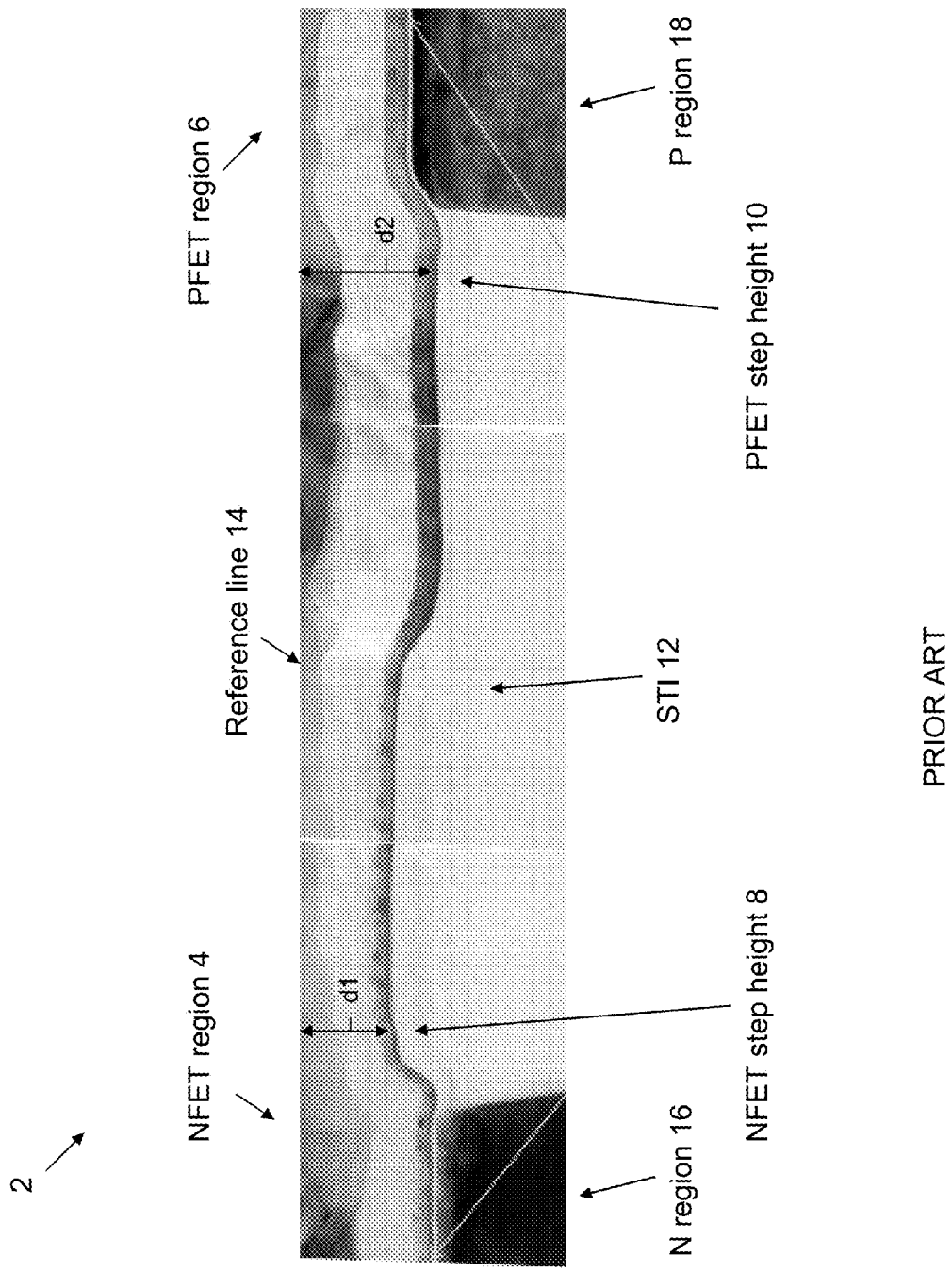
FIG. 1 shows a cut away view of a prior art integrated circuit structure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The subject matter disclosed herein relates to an integrated circuit structure having a substantially planar N-P step height, and methods of forming such a structure. In one aspect of the invention, the step height of an n-type field effect transistor (NFET) is intentionally lowered to create a substantially planar N-P step height in an integrated circuit structure.

In integrated circuits such as field effect transistors (FETs), particularly those utilizing high-k dielectric metal gates, silicon germanium (SiGe) has frequently been used as a channel material. During the process of SiGe growth and patterning in FET structures, the p-type FET (PFET) shallow trench isolation (STI) step height often not co-planar (or, substantially level) with the n-type FET (NFET) STI. This height disparity can cause degraded performance in the FET and its corresponding integrated circuit structure.

For certain technology node device requirements (e.g., 32 nanometers), it may be necessary to use different channel materials on NFET and PFET devices. The channel materials may be grown using epitaxial growth techniques. In high-k/metal-gate technologies, silicon germanium (SiGe) may be used as the PFET channel material to assist in reaching a desired PFET metal-semiconductor workfunction, while a traditional silicon channel is used for the NFET devices. When using epitaxial growth for channel materials on a desired device, a hardmask material such as silicon dioxide ($SiO_2$) or silicon nitride ($SiN_2$) may be used to protect against growth of new channel material on the other devices. The hardmask material is then removed.

Nitride hardmasks are usually not used when growing silicon germanium (SiGe) channel materials. The etchant, such as hot phosphoric acid, used to remove the nitride hardmask also etches the silicon germanium (SiGe) material itself. Patterning of oxide hardmasks with common oxide etchants, such as hydrofluoric acid, also etches the shallow trench isolation (STI) oxide resulting in a different step-height (STI oxide height relative to channel silicon) between NFET and PFET devices. Different size STI divots (amount of STI oxide pulldown immediately next to the active silicon device) may also occur between NFET and pFET devices. Step-height differences and divot differences can create structural topography problems in downstream processing as well as electrical device issues, such as leakage, performance, active width and corner device.

In contrast to the conventional approaches for forming these integrated circuit structures, aspects provide for intentionally lowering the step height of an n-type field effect transistor (NFET) to create a substantially planar N-P step height in an integrated circuit structure.

In one aspect, after performing both conventional chemical mechanical polishing (CMP) on a PFET and NFET structure and subsequent dilute hydrogen-flouride (DHF) cleaning, the PFET region is masked, and an additional DHF cleaning process is performed on the unmasked NFET region. This additional DHF cleaning process may lower the step-height difference between the NFET and PFET regions, thereby producing a substantially planar N-P step height. Subsequent to this additional DHF process, the mask over the PFET region may be removed by conventional methods.

It is understood that some conventional portions of the overall process of forming an integrated circuit structure may be described in a truncated fashion herein for the purposes of clarity.

In one aspect, a method is disclosed including providing a structure having an n-type field effect transistor (NFET) region and a p-type field effect transistor (PFET) region, where the NFET region has an uneven shallow trench isolation (STI) profile. The method may further include forming a mask over the PFET region to leave the NFET region exposed. Further, the method may include performing dilute hydrogen-flouride (DHF) cleaning on the exposed NFET region to substantially planarize the STI profile of the NFET region.

A second aspect includes method of forming an integrated circuit structure having a substantially planar shallow trench isolation (STI) profile. The method may include providing a structure having an n-type field effect transistor (NFET) region and a p-type field effect transistor (PFET) region, where the NFET region has an uneven shallow trench isolation (STI) profile. The method may further include forming a mask over the PFET region to leave the NFET region exposed. Further, the method may include performing dilute hydrogen-flouride (DHF) cleaning on the exposed NFET region to substantially planarize the STI profile of the NFET region.

A third aspect may include an integrated circuit structure having: an n-type field effect transistor (NFET) region having both a first shallow trench isolation (STI) step height, and a p-type field effect transistor (PFET) region having a second STI step height. In this case, the first STI step height may be located at approximately a same device depth as the second STI step height. As will be described further herein, aspects include forming this integrated circuit structure.

In contrast to conventional approaches, the additional DHF cleaning performed in the methods described herein may allow for planarizing of the STI profile of the NFET region. This may improve device performance (by, e.g., reducing voltage deltas between STI regions and reducing source leakage current between NFET and PFET regions) in a device as shown and described herein, as compared with conventional devices.

Turning to FIG. 1, a cut-away view of an integrated circuit structure 2 according the prior art is illustrated. The integrated circuit structure 2 is shown including both an n-type field effect transistor (NFET) region 4 and a p-type field effect transistor (PFET) region 6 as is known in the art. Superfluous description of these elements is omitted herein for clarity. As shown, the prior art integrated circuit structure 2 includes an uneven, or non-planar, NFET shallow trench isolation (STI) step height 8 as compared to the PFET STI step height 10. As described herein, this uneven, or non-planar relationship between STI step heights may cause diminished performance in the integrated circuit structure 2, including, but not limited to voltage change (delta) increases between the STI regions, and increased source leakage current ($Is_{off}$) at the same voltage level between the NFET region 4 and PFET region 6. This may occur, for example, due to residual metal being left over on the NFET region 4 after formation of the NFET STI. As shown, the NFET STI step height (d1) is located at a distinct device depth from the PFET STI step height (d2), relative to a planar reference line 14. That is, the NFET STI step height (d1) is less than (e.g., at a higher device level) than the PFET STI step height (d2).

Figure 2:
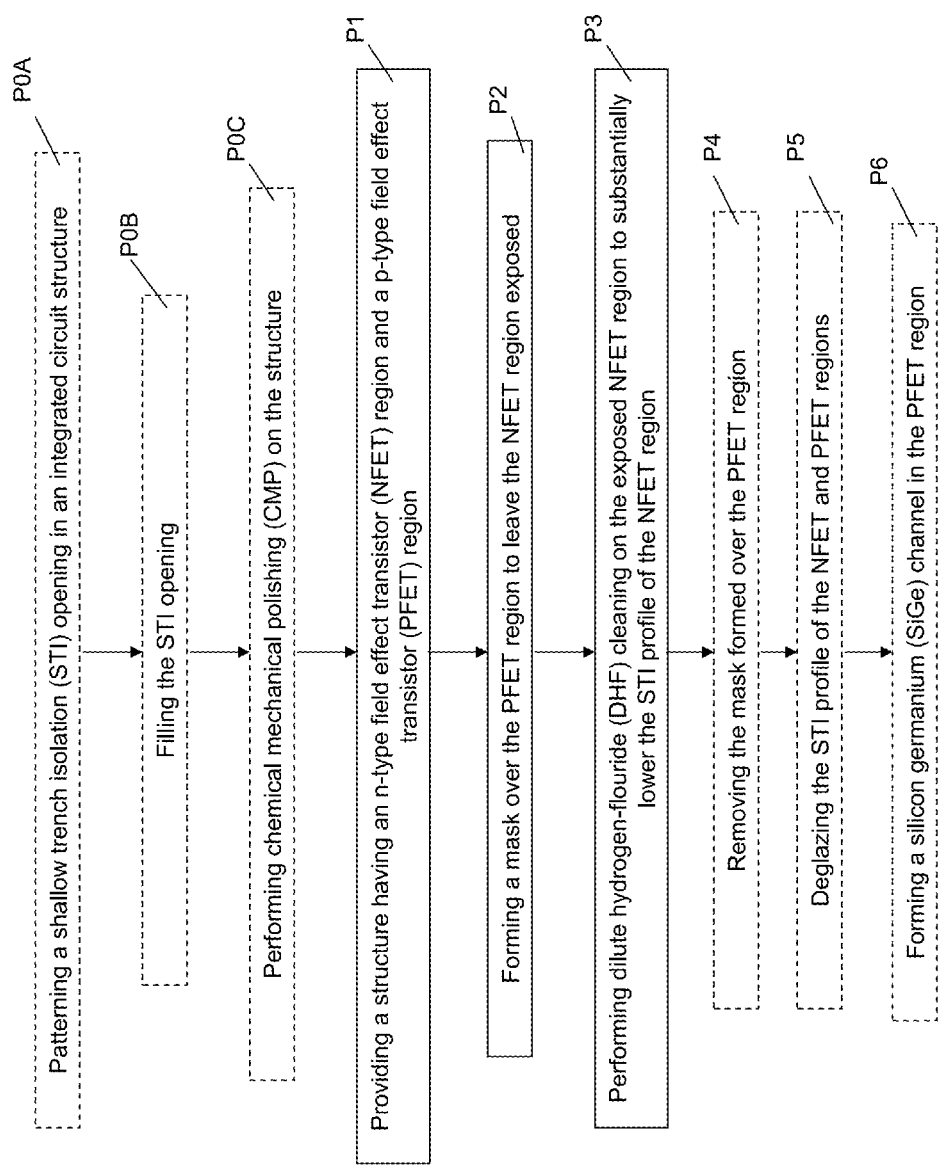
FIG. 2 shows a flow diagram depicting a method according to aspects of the invention.
Figure 3:
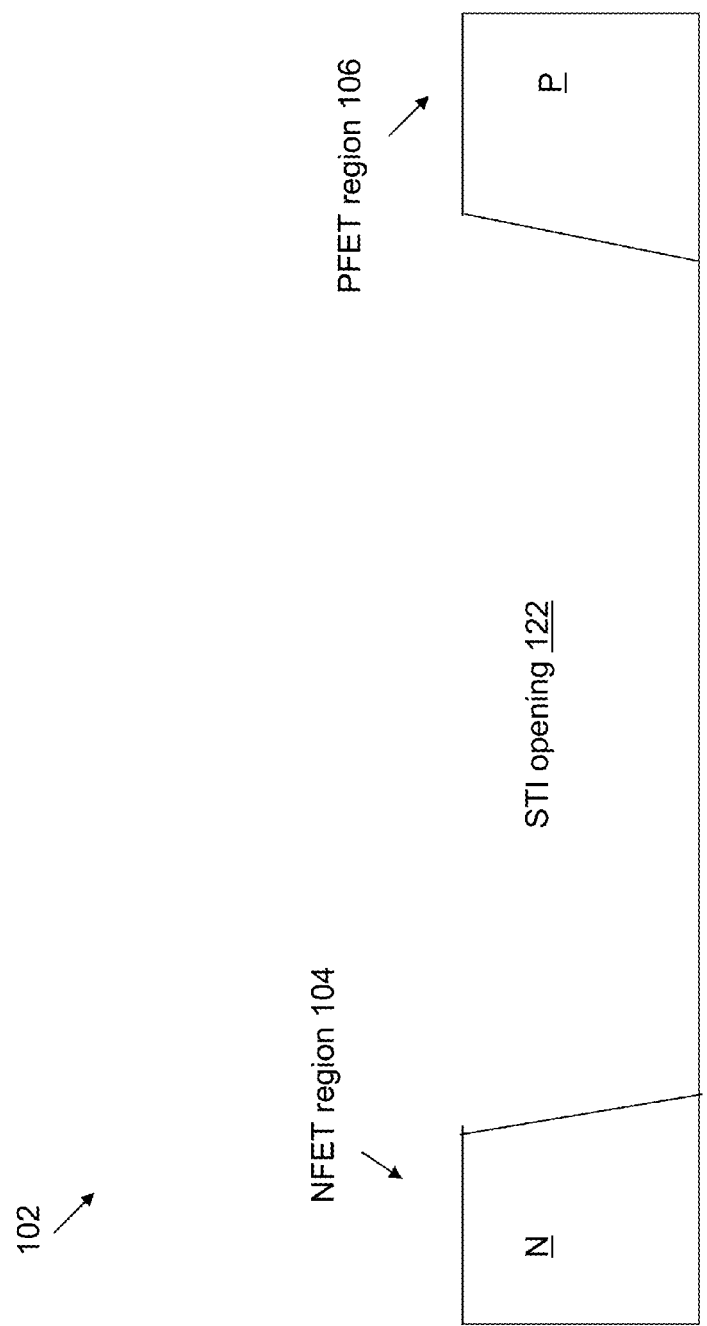
FIGS. 3-5 show processes in forming an integrated circuit structure according to aspects of the invention.
Figure 4:
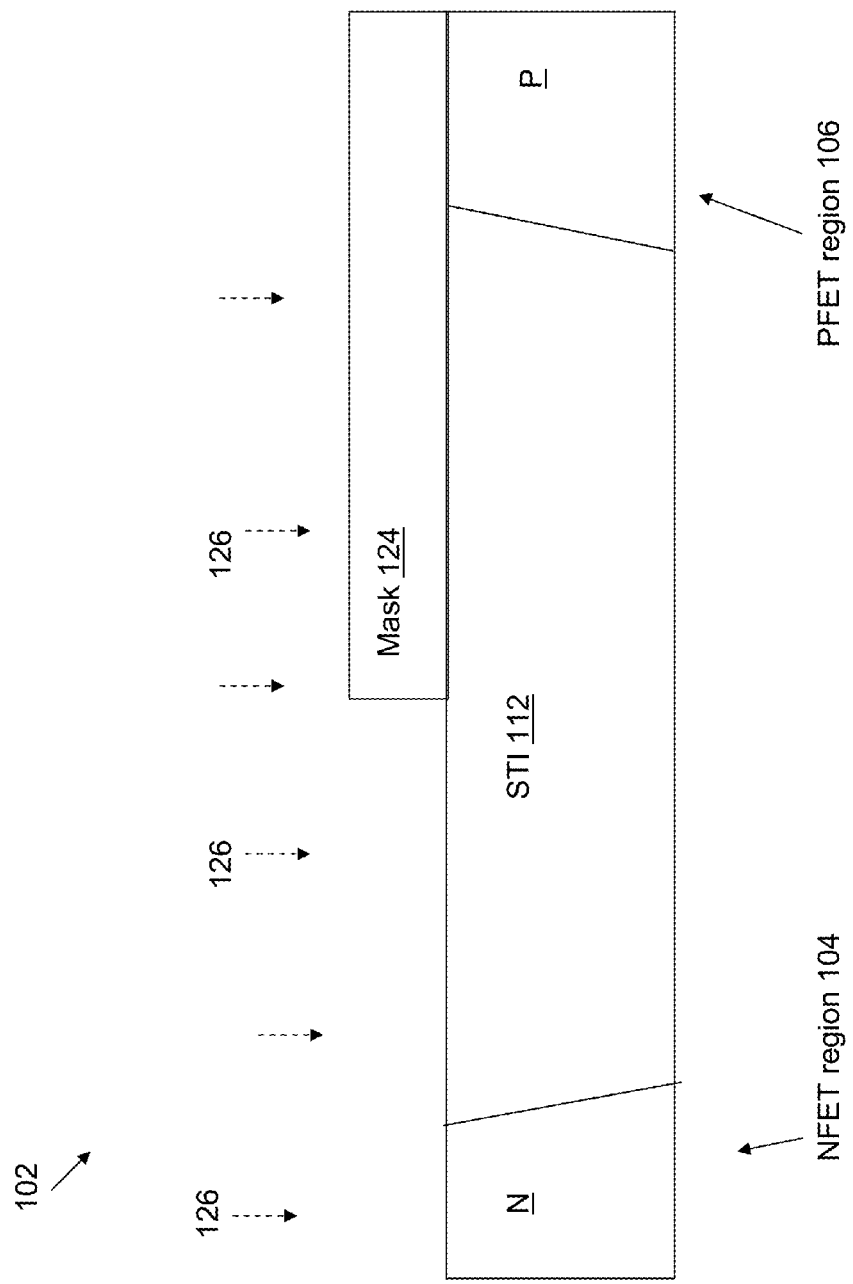

Turning to FIG. 2, a flow diagram illustrating a method according to aspects of the invention is shown. As shown, the flow diagram includes both conventional processes and those processes described herein as not being present in the prior art. It is understood that conventional processes may be described only briefly for the purposes of clarity. Returning to FIG. 2, preliminary process P0A may include patterning a shallow trench isolation (STI) opening in an integrated circuit structure. This process may include using conventional etching and/or photolithography techniques. FIG. 3 more clearly illustrates this process in forming the integrated circuit structure 102 of FIG. 6 (described further herein), where an STI opening 122 is formed between an NFET region 104 and a PFET region 106. Following preliminary process P0A, in process P0B, the STI opening 122 is filled, e.g., via deposition, sputtering, epitaxial growth, etc. FIG. 4 more clearly illustrates the filled STI opening 122 of FIG. 3. In one embodiment, the STI opening 122 may be an NFET STI opening that is filled with a silicon germanium (SiGe) via epitaxial growth. It is understood that filling of the STI opening 122 in this case may be performed in a device having both an NFET STI and a PFET STI. As is know in the art, forming of STI openings 122 (e.g., NFET and PFET) and/or filling of those openings may be performed substantially simultaneously, or in some embodiments, may be performed at different times. Following filling of the STI opening(s) 122, in preliminary process P0C, chemical mechanical polishing (CMP), or chemical mechanical planarization may be performed on the NFET STI and/or the PFET STI (e.g., STI 112). As is known in the art, filling of the STI openings 122 (in process P0B) may result in an over-fill. That is, unwanted material (e.g., silicon, SiGe, etc.) may over-fill the STI (e.g., STI 112 such that additional material is formed above the STI opening 122. Conventionally, this over-fill portion is polished (or planarized) back using CMP. This CMP process (P0C) may also help to planarize an upper surface of the STI, as the name suggests. Over-fill and CMP processes have been omitted in the depictions for the purposes of clarity.

Figure 5:
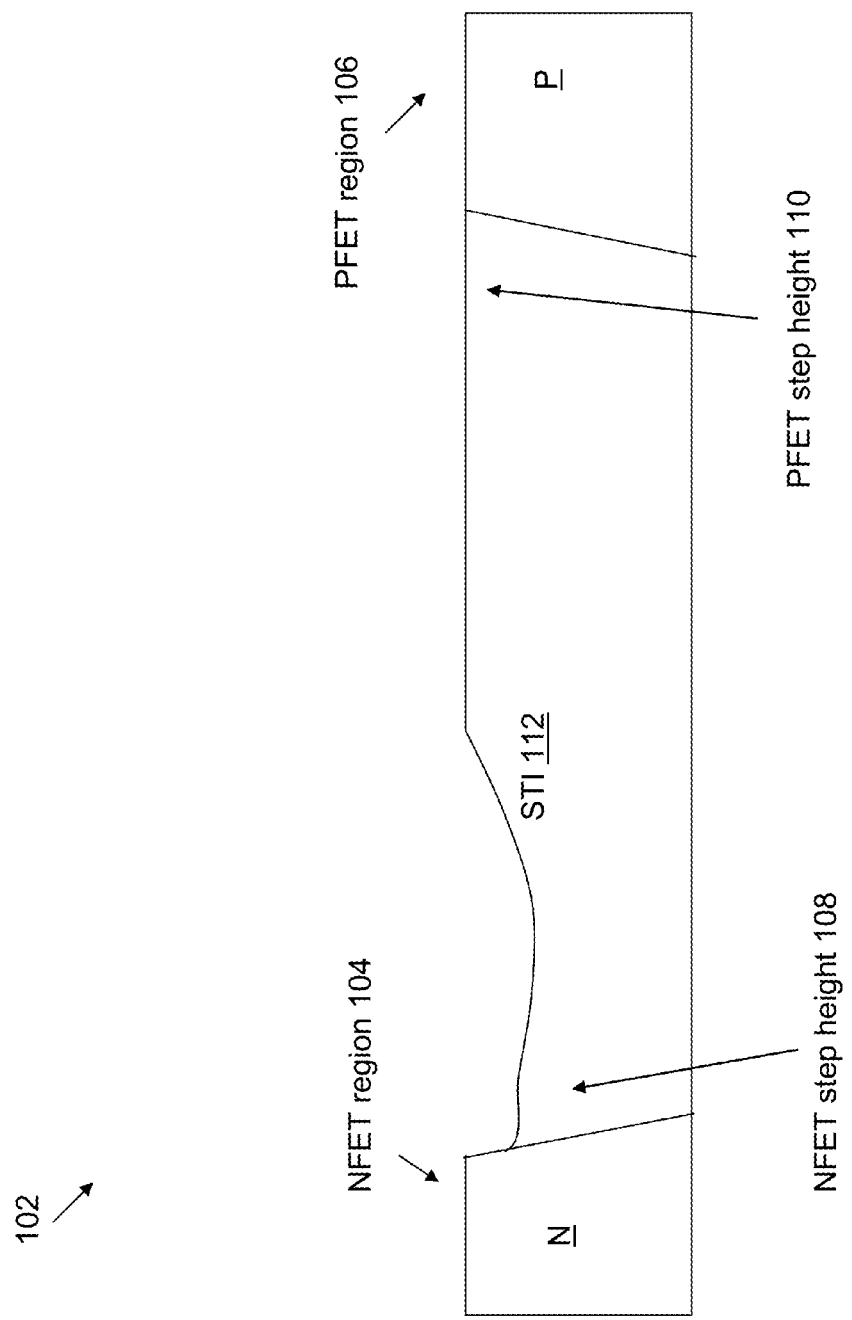

In any case, following the preliminary processes, process P1 may include providing an integrated circuit structure having the NFET region 104 and the PFET region 106, having both an NFET STI profile (or, step height 108) and a PFET STI profile (or, step height 110). It is understood that process P1 may be initiated on an integrated circuit structure such as that shown in FIG. 4 (omitting the mask 124 shown. Following providing of the integrated circuit structure 102, in process P2 (FIG. 4), a mask 124 may be formed over the PFET region (e.g., PFET region 106) to leave the NFET region 104 exposed. This process, along with the subsequent DHF cleaning 126, is illustrated in FIG. 4. In one embodiment, the mask 124 may be formed over approximately half of the STI 112. It is understood that process P2 may include forming a conventional hard-mask or photomask (124) via, e.g., deposition, sputtering, or epitaxial growth. Following forming of the mask 124 over the PFET region 106, in process P3, a dilute hydrogen-flouride (DHF) cleaning 126 may be performed on the exposed NFET region 104 and NFET portion of the STI 112, to substantially lower the STI profile (or, step height) 108 of the NFET region 104. It is understood that DHF cleaning 126 may be performed on the PFET region 106 as well, however, the DHF cleaning 126 performed as described with reference to process P3 is intended to reduce the height (or increase the device depth, e.g., d1) of the NFET portion of the STI 112. That is, the DHF cleaning 126 performed as described with reference to process P3 is in addition to conventional DHF cleaning that may be performed on an STI region 112 (description omitted), and the DHF cleaning 126 of process P3 is not performed on the masked PFET region 106 or the PFET portion of the STI 112. After DHF cleaning 126, the NFET step height 108 may be lowered to preliminarily compensate for later step-height differences, as shown in FIG. 5. Contrasting FIG. 5 with the prior art view of FIG. 1, it is visible that the NFET step height 108 has been lowered for the purposes of finishing processing of the integrated circuit device 102 with a substantially planar NFET step height 108 and PFET step height 110 (and consequently, substantially planar STI profiles).

Following process P4, the mask may be removed (e.g., via conventional etching or bath techniques), and the STI profiles 108, 110 of both the NFET and PFET regions may be deglazed (process P5), as is known in the art. It is understood that processes P4 and P5 may be performed using conventional approaches, and as such, further description is omitted herein for clarity.

As shown in FIG. 5, the integrated circuit structure 102 may include an NFET region 104, a PFET region 106, an STI region 112, and an NFET step height 108 and PFET step height 110. It is understood that the processes described herein may be part of a preliminary process to form an integrate circuit structure having a PFET region 106 including a silicon germanium (SiGe) channel, and as such, processes described herein may be utilized to form substantially planar step heights (or STI profiles) between the STI region 112 and each of the P region and N region. It is understood that as described herein, formation of the SiGe PFET region (including a PFET channel) has not yet occurred in the depiction of FIG. 5, and may occur in a subsequent process P6, illustrated in FIG. 2. That is, after the intentional lowering of the NFET portion of the STI 112 (NFET step height 108), a portion of the PFET channel may be formed using SiGe (e.g., via epitaxial growth of SiGe). After this process, the PFET portion of the STI 112 (which was previously covered in the depiction in FIG. 4), may be etched back. That is, the STI 112 proximate to the PFET region 106 may be etched back to lower the STI 112 proximate to the PFET region 106. This may subsequently lower the PFET portion of the STI 112, allowing for a substantially planar PFET step height 110 and NFET step height 108. In contrast to the conventional integrated circuit structure 2 in FIG. 1, the integrated circuit structure 102 may include substantially even device depths at the NFET region 104 and PFET regions 106.

It is further understood that additional conventional processes may be performed on the integrated circuit structure after the formation of the SiGE region (process P6), however, further description of those conventional processes are omitted for the purposes of clarity.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
providing a structure having an n-type field effect transistor (NFET) region and a p-type field effect transistor (PFET) region, wherein the structure includes a shallow trench isolation (STI) between the NFET region and the PFET region;
forming a mask over the PFET region to leave the NFET region exposed, wherein the forming of the mask over the PFET region includes forming the mask over approximately half of the STI;
performing dilute hydrogen-flouride (DHF) cleaning on the exposed NFET region to substantially lower an STI profile of the NFET region while the mask remains over the PFET region;
forming a silicon germanium (SiGe) channel in the PFET region after the performing of the DHF; and
etching a portion of the STI proximate the PFET region to substantially planarize the STI profile of the NFET region and an STI profile of the PFET region after the forming of the silicon germanium (SiGe) channel in the PFET region.

2. The method of claim 1, further comprising removing the mask formed over the PFET region after the DHF cleaning, wherein the removing of the mask is performed using an etching technique or a bath technique.

3. The method of claim 1, further comprising performing chemical mechanical polishing (CMP) on the structure before the forming of the mask over the PFET region.

4. The method of claim 3, further comprising patterning a shallow trench isolation (STI) opening prior to the performing of the CMP on the structure.

5. The method of claim 4, further comprising filling the STI opening prior to the performing of the CMP on the structure to form the STI.

6. The method of claim 1, further comprising deglazing the STI profile of the NFET region after the DHF cleaning.

7. The method of claim 1, wherein the forming of the mask over the PFET region to leave the NFET region exposed includes completely covering the PFET region and leaving the NFET region completely exposed.

8. A method of forming an integrated circuit structure having a substantially planar shallow trench isolation (STI) profile across an n-type field effect transistor (NFET) region and a p-type field effect transistor (PFET) region, the method comprising:
providing a structure having the NFET region and the PFET region, wherein the structure includes a shallow trench isolation (STI) between the NFET region and the PFET region;

forming a mask over the entire PFET region to leave the NFET region entirely exposed, wherein the forming of the mask over the PFET region includes forming the mask over approximately half of the STI;

performing dilute hydrogen-flouride (DHF) cleaning on the exposed NFET region to substantially lower an STI profile of the NFET region while the mask covers the PFET region, wherein the substantially lower STI profile allows for planarizing of the STI profile of the NFET region and an STI profile of the PFET region after subsequent formation of a silicon germanium (SiGe) portion of the PFET region;

removing the mask formed over the PFET region after the DHF cleaning using an etching technique or a bath technique; and etching a portion of the STI proximate the PFET region to substantially planarize the STI profile of the NFET region and the STI profile of the PFET region after the forming of the silicon germanium (SiGe) channel in the PFET region and the removing of the mask formed over the PFET region.

9. The method of claim 8, further comprising performing chemical mechanical polishing (CMP) on the structure before the forming of the mask over the PFET region.

10. The method of claim 9, further comprising patterning a shallow trench isolation (STI) opening prior to the performing of the CMP on the structure.

11. The method of claim 10, further comprising filling the STI opening prior to the performing of the CMP on the structure to form the STI.

12. The method of claim 8, further comprising deglazing the STI profile of the NFET region after the DHF cleaning.

13. The method of claim 7, further comprising performing a dilute hydrogen-fluoride (DHF) cleaning on the device, wherein the mask prevents the DHF cleaning on the PFET region and permits the DHF cleaning on the NFET region, and wherein the DHF cleaning lowers only the STI profile of the NFET region.

14. The method of claim 13, wherein the lowered STI profile includes a distinct device depth in the STI adjacent the NFET region than a device depth in the NFET region.

15. The method of claim 8, further comprising forming a silicon germanium (SiGE) channel in the PFET region after the removing of the mask over the PFET region.

* * * * *